US011908786B2

United States Patent
Hsu

(10) Patent No.: US 11,908,786 B2
(45) Date of Patent: Feb. 20, 2024

(54) WIRING STRUCTURE

(71) Applicant: Advanced Semiconductor Engineering, Inc., Kaohsiung (TW)

(72) Inventor: Ting Wei Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 40 days.

(21) Appl. No.: 17/676,091

(22) Filed: Feb. 18, 2022

(65) Prior Publication Data

US 2023/0268264 A1    Aug. 24, 2023

(51) Int. Cl.
*H05K 1/02*      (2006.01)
*H01L 23/498*    (2006.01)
*H01L 23/367*    (2006.01)

(52) U.S. Cl.
CPC ...... *H01L 23/49838* (2013.01); *H01L 23/367* (2013.01); *H01L 23/49822* (2013.01); *H05K 1/0201* (2013.01); *H05K 1/0268* (2013.01)

(58) Field of Classification Search
CPC ........... H05K 1/0209; H05K 2203/162; H05K 1/0201
See application file for complete search history.

(56) References Cited

FOREIGN PATENT DOCUMENTS

CN           104685619 A  *  6/2015    ............. H01L 23/13

OTHER PUBLICATIONS

Machine Translation of CN-104685619-A Jun. 2015 (Year: 2015).*

* cited by examiner

*Primary Examiner* — Jeremy C Norris
(74) *Attorney, Agent, or Firm* — FOLEY & LARDNER LLP

(57) ABSTRACT

A wiring structure includes a test pattern layer. The test pattern layer includes a test circuit pattern and a heat dissipating structure. The heat dissipating structure is disposed adjacent to the test circuit pattern, and is configured to reduce temperature rise of the test circuit pattern when a power is applied to the test circuit pattern.

19 Claims, 16 Drawing Sheets

WIRING STRUCTURE

BACKGROUND

1. Field of the Disclosure

The present disclosure relates to a wiring structure, and to a wiring structure including a test pattern layer.

2. Description of the Related Art

Along with the rapid development in electronics industry and the progress of semiconductor processing technologies, a substrate structure of a semiconductor package structure is used to carry an increasing number of electronic components or electronic devices to achieve improved electrical performance and additional functions. Accordingly, the conductive circuit layer in the substrate structure needs to be finer and finer. However, the fine conductive circuit layer in the substrate structure may not be formed perfectly, and a defect (e.g., a thickness deviation or a width deviation) of the conductive circuit layer may reduce the yield of the substrate structure and the semiconductor package structure. In a worst defect, the fine conductive circuit layer may be cracked or broken, which may result in an open circuit and render the substrate structure and the semiconductor package structure inoperative. Thus, a detection or measurement of such defect of the fine conductive circuit layer during a manufacturing process is a critical issue.

SUMMARY

In some embodiments, a wiring structure includes a test pattern layer. The test pattern layer includes a test circuit pattern and a heat dissipating structure. The heat dissipating structure is disposed adjacent to the test circuit pattern, and is configured to reduce temperature rise of the test circuit pattern when a power is applied to the test circuit pattern.

In some embodiments, a wiring structure includes a dielectric layer, a circuit pattern layer and a test pattern layer. The circuit pattern layer is disposed on the dielectric layer. The test pattern layer is disposed on the dielectric layer, and is spaced apart from the circuit pattern layer. The test pattern layer includes a test circuit pattern and an etching buffer layer. The etching buffer layer is disposed adjacent to the test circuit pattern, and is configured to reduce a delamination between the test circuit pattern and the dielectric layer.

In some embodiments, a wiring structure includes a dielectric layer, a circuit pattern layer and a test pattern layer. The dielectric layer has a first region and a second region. The circuit pattern layer is disposed in the first region. The test pattern layer is disposed in the second region, and includes at least two test circuit patterns and a heat dissipating layer. The test circuit patterns are intersected with each other at an intersection portion. The heat dissipating layer is disposed around the intersection portion.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
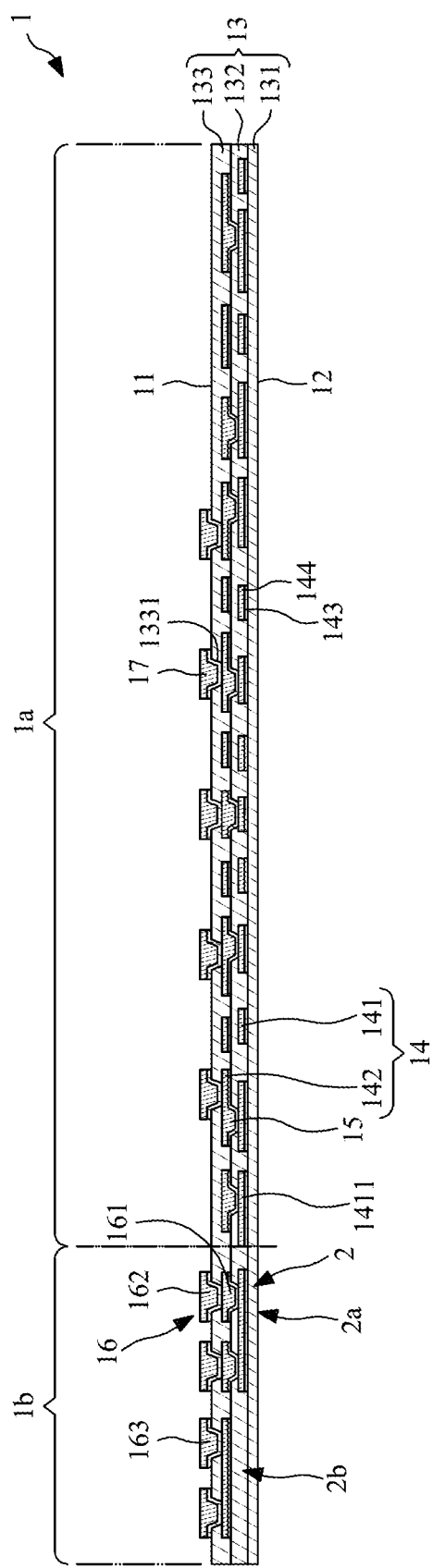
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a wiring structure 1 according to some embodiments of the present disclosure. In some embodiments, the wiring structure 1 may be a pattern circuit structure, a redistribution structure, a conductive structure or a package structure. The wiring structure 1 may have a top surface 11 and a bottom surface 12 opposite to the top surface 11, and may include a dielectric structure 13, at least one redistribution layer 14, a plurality of inner vias 15, a plurality of bonding pads 17, at least one test structure 2 and a plurality of testing vias 16. As shown in FIG. 1, the wiring structure 1 may have a first region 1a and a second region 1b outside or around the first region 1a. The redistribution layer 14, the inner vias 15 and the bonding pads 17 are disposed or located in the first region 1a. The test structure 2 and the testing vias 16 are disposed or located in the second region 1b.

The dielectric structure 13 may include a plurality of dielectric layers (including, for example, a first dielectric layer 131, a second dielectric layers 132 and a third dielectric layer 133). The dielectric layers 131, 132, 133 may be stacked on one another. For example, first dielectric layer 131 may have the first region 1a and the second region 1b. For example, the second dielectric layers 132 may be disposed on a top surface of the first dielectric layer 131, and the third dielectric layers 133 may be disposed on a top surface of the second dielectric layer 132. The dielectric layers 131, 132, 133 may be made of a cured photoimageable dielectric (PID) material such as epoxy or polyimide (PI) including photoinitiators. The redistribution layer 14 may be embedded in the dielectric structure 13 and may include a plurality of circuit pattern layers 141, 142 such as a first circuit pattern layer 141 and a second circuit pattern layer 142. Each of the circuit pattern layers 141, 142 may be a conductive layer 144 that is disposed on include a seed layer 143. In some embodiments, the seed layer 143 may be omitted.

The inner vias 15 may electrically connect at least one circuit pattern layer 141, 142 or two adjacent circuit pattern layers 141, 142 of the redistribution layer 14. In some embodiments, the inner vias 15 may taper downward. That is, a width of each of the inner vias 15 may gradually decrease toward the first dielectric layer 131 or toward the bottom surface 12 of the wiring structure 1. In addition, the first dielectric layer 131 may define a plurality of openings (not shown) extending through the first dielectric layer 131 to expose portions of the first circuit pattern layer 141 of the redistribution layer 14. The first circuit pattern layer 141 may be disposed on the first dielectric layer 131, and may be covered by the second dielectric layers 132. The second circuit pattern layer 142 may be disposed on the second dielectric layer 132, and may be covered by the third dielectric layer 133. The third dielectric layer 133 and may define a plurality of openings 1331 to expose portions of the second circuit pattern layer 142. The bonding pads 17 may be disposed in the openings 1331 of the third dielectric layer 133 and on the exposed portions of the second circuit pattern layer 142. The bonding pads 17 may protrude from a top surface 11 of the wiring structure 1.

The redistribution layer 14, the inner vias 15 and the bonding pads 17 that are disposed or located in the first region 1a are configured to transmit signals, receiving power or grounding. That is, the redistribution layer 14, the inner vias 15 and the bonding pads 17 have electrical function. In some embodiments, the wiring structure 1 may be also referred to as "a stacked structure" or "a high-density electronic structure" or "a high-density stacked structure." The redistribution layer 14 (including, for example, the circuit pattern layers 141, 142) of the wiring structure 1 may be also referred to as "a high-density redistribution layer." The circuit pattern layers 141, 142 may be fan-out circuit layers or redistribution layers (RDLs), and a line width/line space (L/S) of the circuit pattern layer 141, 142 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm.

The test structure 2 and the testing vias 16 that are disposed or located in the second region 1b is physically isolated and electrically isolated from the redistribution layer 14 (including, for example, the circuit pattern layers 141, 142). Thus, the electrical path from the bonding pads 17 may not pass through the test structure 2 and the testing vias 16. The test structure 2 may include a first test pattern layer 2a and a second test pattern layer 2b. Each of the first test pattern layer 2a and the second test pattern layer 2b may be a test circuit or a test structure. The first test pattern layer 2a may be disposed on the first dielectric layer 131. For example, the first test pattern layer 2a and the first circuit pattern layer 141 may be disposed at the same layer, and they may be formed concurrently at a same manufacturing stage or process. The first circuit pattern layer 141 is spaced apart from the first test pattern layer 2a.

The testing vias 16 may include a plurality of first testing vias 161, a plurality of second testing vias 162 and a plurality of third testing vias 163. The first testing vias 161 are disposed in the second dielectric layers 132, and may extend through the second dielectric layers 132. Further, the first testing vias 161 may be disposed above the first test pattern layer 2a, and may physically connect and electrically connect the first test pattern layer 2a. The first testing vias 161 and the inner vias 15 may be disposed at the same layer, and they may be formed concurrently at a same manufacturing stage or process. The second testing vias 162 are disposed in the third dielectric layers 133, and may extend through the third dielectric layers 133. Further, the second testing vias 162 may be disposed above the testing vias 161, and may physically connect and electrically connect the first testing vias 161. The third testing vias 163 are disposed in the third dielectric layers 133, and may extend through the third dielectric layers 133. Further, the third testing vias 163 may be disposed above the second test pattern layer 2b, and may physically connect and electrically connect the second test structure 2b. The second testing vias 162, the third testing vias 163 and the bonding pads 17 may be disposed at the same layer, and they may be formed concurrently at a same manufacturing stage or process.

Figure 2:
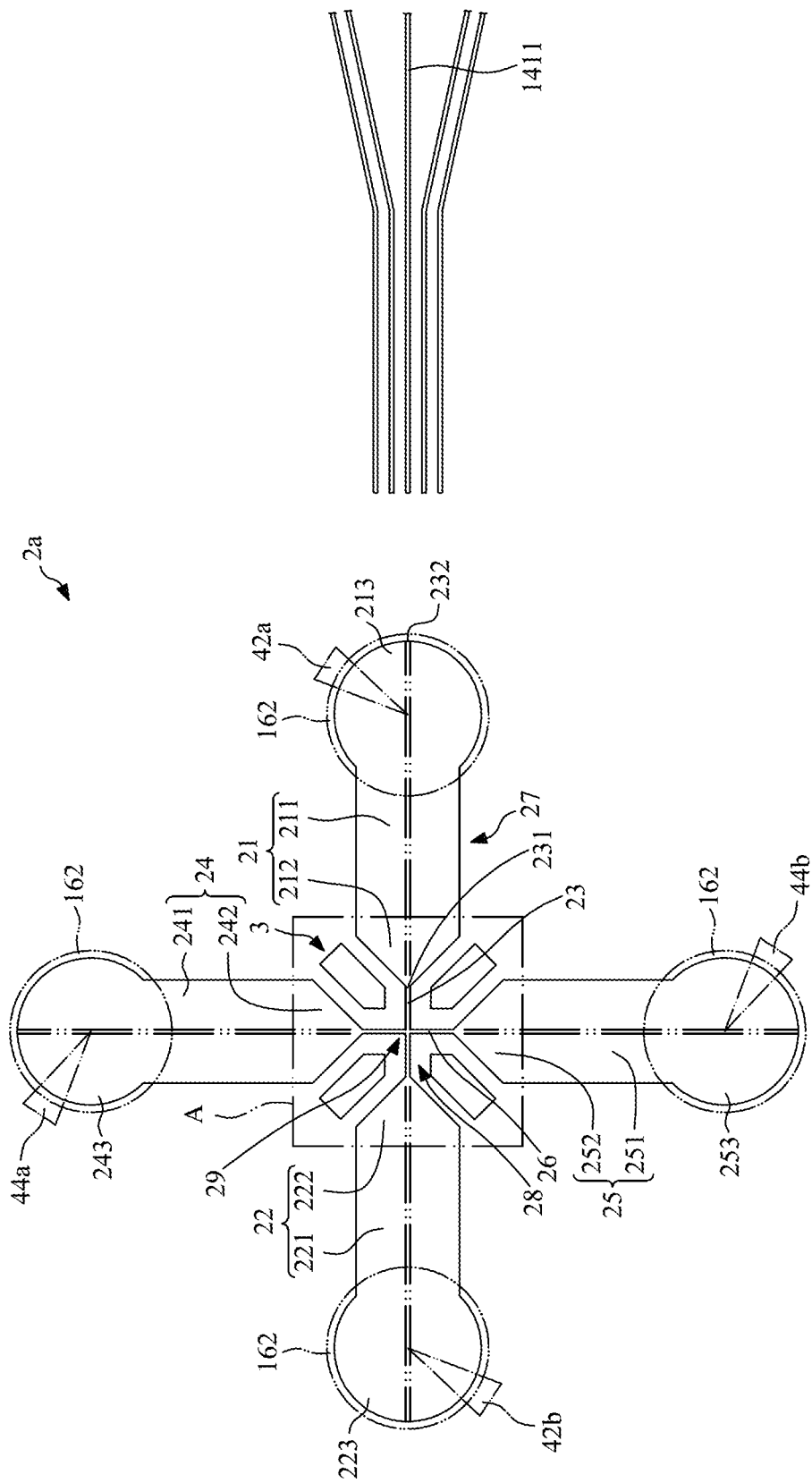
FIG. 2 illustrates a top view of the first test structure and a portion of the first circuit pattern layer of FIG. 1.
Figure 3:
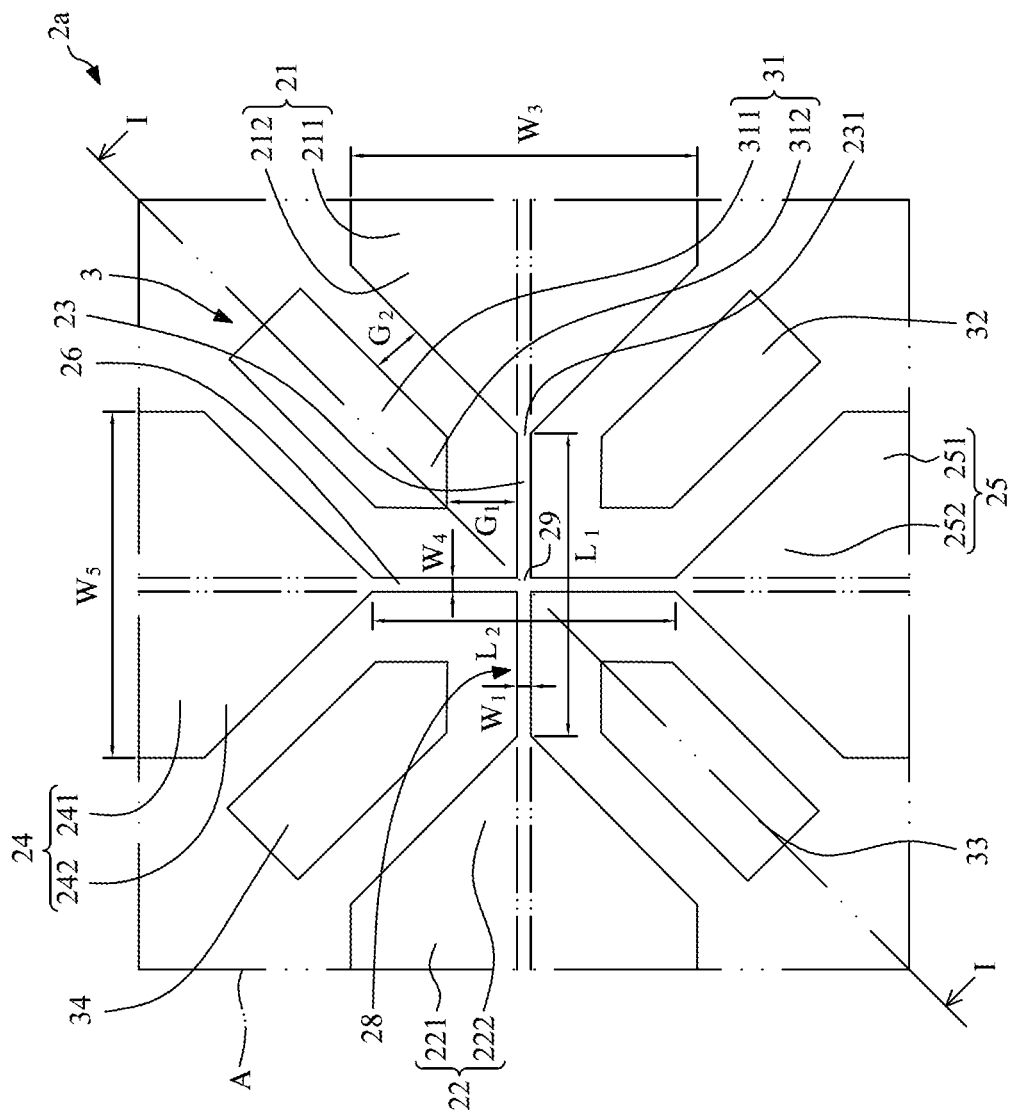
FIG. 3 illustrates an enlarged view of an area "A" of FIG. 2.
Figure 3A:
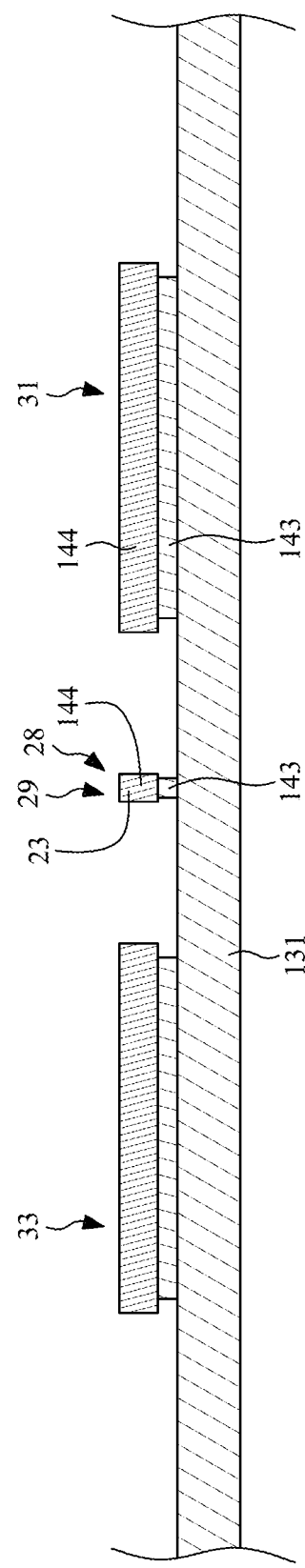
FIG. 3A illustrates a cross-sectional view taken along line I-I of FIG. 3.
Figure 4:
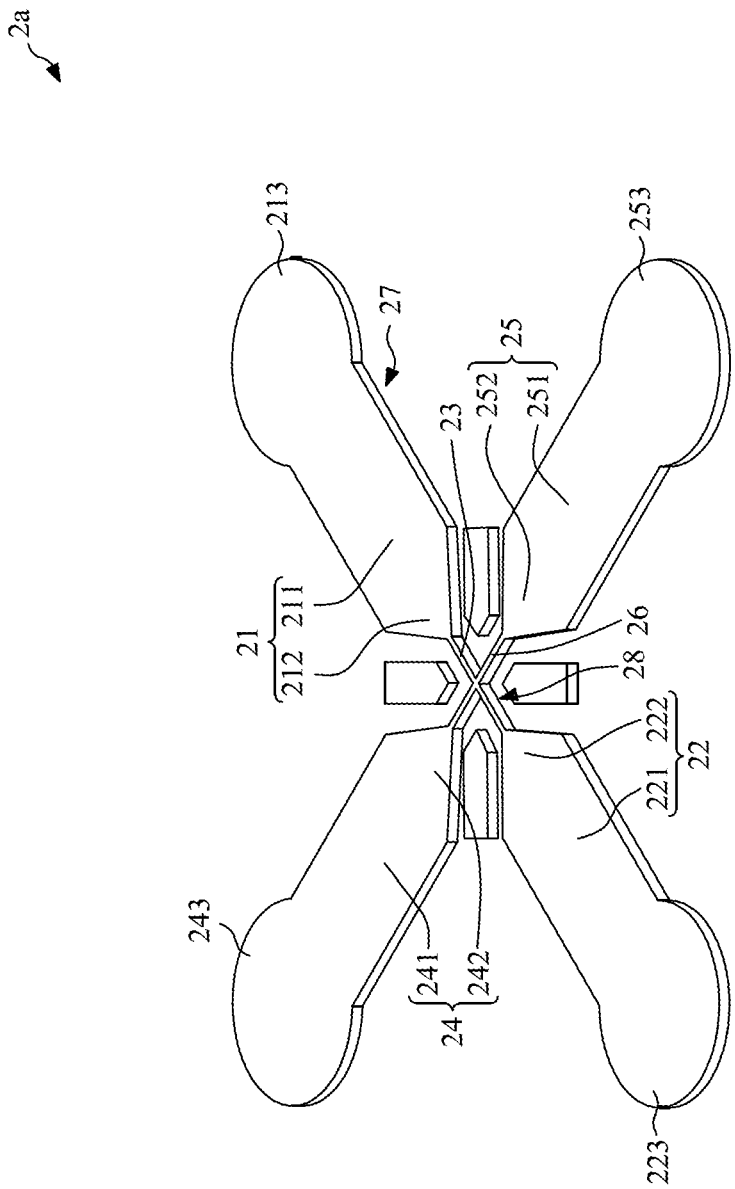
FIG. 4 illustrates a perspective view of the first test structure of FIG. 2.

FIG. 2 illustrates a top view of the first test pattern layer 2a and a portion of the first circuit pattern layer 141 of FIG. 1. FIG. 3 illustrates an enlarged view of an area "A" of FIG. 2. FIG. 3A illustrates a cross-sectional view taken along line I-I of FIG. 3. FIG. 4 illustrates a perspective view of the first test pattern layer 2a of FIG. 2. The first test pattern layer 2a may include a heat dissipating layer 27, a test structure 28 thermally connected and electrically connected to the heat dissipating layer 27 and an etching buffer structure 3. The heat dissipating layer 27 may include at least two heat dissipating structures, for example, a first heat dissipating structure 21, a second heat dissipating structure 22, a third heat dissipating structure 24 and a fourth heat dissipating structure 25. Each of the heat dissipating structures may be also referred to as "a heat dissipating pattern."

The test structure 28 may include at least one test circuit pattern. For example, the test structure 28 may include a plurality of test circuit patterns (or test lines) such as a first test circuit pattern 23 and a second test circuit pattern 26. The first test circuit pattern 23 may connect the first heat dissipating structure 21 and the second heat dissipating structure 22, and the second test circuit pattern 26 may connect the third heat dissipating structure 24 and the fourth heat dissipating structure 25. The heat dissipating layer 27 (including the first heat dissipating structure 21, the second heat dissipating structure 22, the third heat dissipating structure 24 and the fourth heat dissipating structure 25) may be adjacent to the test structure 28 (including the first test circuit pattern 23 and the second test circuit pattern 26).

The first heat dissipating structure 21 may be disposed along the first test circuit pattern 23. For example, the first heat dissipating structure 21 may include a pattern extending from the first test circuit pattern 23. The first test circuit pattern 23 may have a consistent width $W_1$ which is substantially equal to a width $W_4$ of the second test circuit pattern 26. The first test circuit pattern 23 may be intersected with the second test circuit pattern 26 to form an intersection portion 29. Thus, the first test circuit pattern 23 and the second test circuit pattern 26 may be intersected with each other at the intersection portion 29. The first test circuit pattern 23 may be nonparallel with the second test circuit pattern 26. For example, the first test circuit pattern 23 is substantially perpendicular to the second test circuit pattern 26. The intersection portion 29 may be a center of the test structure 28. The heat dissipating layer 27 (including the first heat dissipating structure 21, the second heat dissipating structure 22, the third heat dissipating structure 24 and the fourth heat dissipating structure 25) may be spaced apart from the intersection portion 29. The intersection portion 29 may be in a square shape. The heat dissipating layer 27 (including the first heat dissipating structure 21, the second heat dissipating structure 22, the third heat dissipating structure 24 and the fourth heat dissipating structure 25) may be disposed around the intersection portion 29. Each of the heat dissipating structures 21, 22, 24, 25 may be also referred to as "a segment." Thus, the heat dissipating layer 27 may include four segments 21, 22, 24, 25 extending outwardly along a direction from the intersection portion 29.

The width $W_1$ of the first test circuit pattern 23 may be designed to be substantially equal to a width of a conductive line 1411 of the first circuit pattern layer 141, and the width $W_4$ of the second test circuit pattern 26 may be designed to be substantially equal to the width of the conductive line 1411 of the first circuit pattern layer 141. A width of the intersection portion 29 may be substantially equal to the width of the conductive line 1411 of the first circuit pattern layer. Thus, during a manufacturing process, the condition or dimension (e.g., a width or a thickness) of the first test circuit pattern 23 and the second test circuit pattern 26 may be presumed to be the same as the condition or dimension (e.g., a width or a thickness) of the conductive line 1411 of the first circuit pattern layer 141. The test structure 28 (including the first test circuit pattern 23 and the second test circuit pattern 26) may simulate the condition of the conductive line 1411 of the first circuit pattern layer 141 after an etching process. The condition of the first circuit pattern layer 141 can be detected by testing or measuring the test structure 28 (including the first test circuit pattern 23 and the second test circuit pattern 26).

In some embodiments, the first heat dissipating structure 21, the second heat dissipating structure 22 and the first test circuit pattern 23 may constitute a first conductive path, and may be formed concurrently and integrally. Thus, there may be no boundary between the first heat dissipating structure 21, the first test circuit pattern 23 and the second heat dissipating structure 22. In addition, the third heat dissipating structure 24, the fourth heat dissipating structure 25 and the second test circuit pattern 26 may constitute a second conductive path, and may be formed concurrently and integrally. Thus, there may be no boundary between the third heat dissipating structure 24, the second test circuit pattern 26 and the fourth heat dissipating structure 25. The first conductive path (including the first heat dissipating structure 21, the second heat dissipating structure 22 and the first test circuit pattern 23) and the second conductive path (including the third heat dissipating structure 24, the fourth heat dissipating structure 25 and the second test circuit pattern 26) may be formed concurrently and integrally.

The first test circuit pattern 23 may include a connection portion 231 and an end portion 232. The connection portion 231 may be also an end portion. The first heat dissipating structure 21 is closer to the end portion 232 than the intersection portion 29 is. The first heat dissipating structure 21 is closer to the connection portion 231 than the intersection portion 29 is. The first heat dissipating structure 21 may include a main portion 211 (e.g., a pattern), a tapering portion 212 (e.g., a pattern) and a first pad portion 213. The tapering portion 212 of the first heat dissipating structure 21 may connect the main portion 211 and the first test circuit pattern 23. The tapering portion 212 of the first heat dissipating structure 21 is tapered from the main portion 211 toward the intersection portion 29. Thus, a width of the tapering portion 212 of the first heat dissipating structure 21 decreases from the main portion 211 toward the intersection portion 29. The main portion 211 of the first heat dissipating structure 21 has a consistent width $W_3$. The width $W_1$ of the first test circuit pattern 23 is less than the width $W_3$ of the main portion 211 of the first heat dissipating structure 21. The first pad portion 213 connects to the main portion 211.

Further, the second heat dissipating structure 22 may include a main portion 221, a tapering portion 222 and a second pad portion 223. The tapering portion 222 of the second heat dissipating structure 22 may connect the main portion 221 and the first test circuit pattern 23. The tapering portion 222 of the second heat dissipating structure 22 is tapered toward the intersection portion 29. Thus, a width of the tapering portion 222 of the second heat dissipating structure 22 decreases from the main portion 221 toward the intersection portion 29. The main portion 221 of the second heat dissipating structure 22 has a consistent width which may be equal to the width $W_3$. The width $W_1$ of the first test circuit pattern 23 is less than the width of the main portion 221 of the second heat dissipating structure 22. The second pad portion 223 connects to the main portion 221.

The third heat dissipating structure 24 may include a main portion 241, a tapering portion 242 and a third pad portion 243. The tapering portion 242 of the third heat dissipating structure 24 may connect the main portion 241 and the second test circuit pattern 26. The tapering portion 242 of the third heat dissipating structure 24 is tapered toward the intersection portion 29. Thus, a width of the tapering portion 242 of the third heat dissipating structure 24 decreases from the main portion 241 toward the intersection portion 29. The main portion 241 of the third heat dissipating structure 24 has a consistent width $W_5$. The width $W_4$ of the second test circuit pattern 26 is less than the width $W_5$ of the main portion 241 of the third heat dissipating structure 24. The third pad portion 243 connects to the main portion 241.

Further, the fourth heat dissipating structure 25 may include a main portion 251, a tapering portion 252 and a fourth pad portion 253. The tapering portion 252 of the fourth heat dissipating structure 25 may connects the main portion 251 and the second test circuit pattern 26. The tapering portion 252 of the fourth heat dissipating structure 25 is tapered toward the intersection portion 29. Thus, a width of the tapering portion 252 of the fourth heat dissipating structure 25 decreases from the main portion 251 toward the intersection portion 29. The main portion 251 of the fourth heat dissipating structure 25 has a consistent width which may be equal to the width $W_5$. The width $W_4$ of the second test circuit pattern 26 is less than the width of the main portion 251 of the fourth heat dissipating structure 25. The fourth pad portion 253 connects to the main portion 251.

A length $L_1$ of the first test circuit pattern 23 of the first conductive path is less than the width $W_5$ of the main portion 241 of the third heat dissipating structure 24 of the second conductive path. A length $L_2$ of the second test circuit pattern 26 of the second conductive path is less than the width $W_3$ of the main portion 211 of the first heat dissipating structure 21 of the first conductive path. As shown in FIGS. 1 and 2, the first testing vias 161 and the second testing vias 162 extend along a direction perpendicular to the heat dissipating structures 21, 22, 24, 25 of the heat dissipating layer 27. The first testing vias 161 may contact the first pad portion 213 of the first heat dissipating structure 21, the second pad portion 223 of the second heat dissipating structure 22, the third pad portion 243 of the third heat dissipating structure 24 and the fourth pad portion 253 of the fourth heat dissipating structure 25.

The etching buffer structure 3 may include at least one blocking structure. The at least one blocking structure may include a plurality of blocking structures (including, for example, a first blocking structure 31, a second blocking structure 32, a third blocking structure 33 and a fourth blocking structure 34) disposed adjacent to and spaced apart from the test structure 28 (including the first test circuit pattern 23 and the second test circuit pattern 26). The etching buffer structure 3 (including, for example, the first blocking structure 31, the second blocking structure 32, the third blocking structure 33 and the fourth blocking structure 34) may be disposed between the test circuit patterns 23, 26. Each of the blocking structures 31, 32, 33, 34 may be also referred to as "a second heat dissipating pattern", and may be a portion of the heat dissipating layer 27. Each of the blocking structures 31, 32, 33, 34 may be also referred to as "a segment." The blocking structures (including, the first blocking structure 31, the second blocking structure 32, the third blocking structure 33 and the fourth blocking structure 34) are dummy. That is, there may be no electrical current or electrical path passes through the blocking structures (including, the first blocking structure 31, the second blocking structure 32, the third blocking structure 33 and the fourth blocking structure 34).

The first blocking structure 31 may be disposed in a space defined by the tapering portion 212 of the first heat dissipating structure 21, the first test circuit pattern 23, the second test circuit pattern 26 and the tapering portion 242 of the third heat dissipating structure 21. The first blocking structure 31 may include a main portion 311 and a tapering portion 312 extending from the main portion 311. The tapering portion 312 of the first blocking structure 31 tapers from the main portion 311 of the segment 31 toward the intersection portion 29 of the test structure 28. The main portion 311 of the first blocking structure 31 has a consistent width. The etching buffer structure 3 is used to prevent excess etchant from attacking the seed layer 143 during an etching process, so as to reduce a delamination between the test structure 28 (including the first test circuit pattern 23 and the second test circuit pattern 26) and the first dielectric layer 131.

As shown in FIG. 3, the width $W_1$ of the first test circuit pattern 23 is less than a gap $G_1$ between the first test circuit pattern 23 and the tapering portion 312 of the first blocking structure 31. Further, the width $W_1$ of the first test circuit pattern 23 is less than a gap $G_2$ between the tapering portion 212 of the first heat dissipating structure 21 and the main portion 311 of the first blocking structure 31. A width of the main portion 311 of the first blocking structure 31 of the etching buffer structure 3 may be less than the width $W_1$ of a portion of the first test circuit pattern 23. The shape of each of the second blocking structure 32, the third blocking structure 33 and the fourth blocking structure 34 may be same as the shape of the first blocking structure 31. The etching buffer layer 3 is closer to the intersection portion 29 than the end portion 232 is.

Referring to FIG. 3A, the seed layer 143 is disposed between the first test circuit pattern 23 (e.g., a conductive layer 144) and the first dielectric layer 131. The seed layer 143 may be etched during an etching process, thus, a width of the seed layer 143 may be less than a width of the first test circuit pattern 23 (e.g., a conductive layer 144). A thickness of the first blocking structure 31 of the etching buffer layer 3 may be substantially equal to a thickness of the first test circuit pattern 23.

Referred to FIG. 1, the second test pattern layer 2b may be disposed on the second dielectric layer 132. For example, the second test pattern layer 2b and the second circuit pattern layer 142 may be disposed at the same layer, and they may be formed concurrently at a same manufacturing stage or process. The structure of the second test pattern layer 2b may be similar to or same as the structure of the first test pattern layer 2a. During a manufacturing process, the condition or dimension (e.g., a width or a thickness) of the test lines of the second test pattern layer 2b may be presumed to be the same as the condition or dimension (e.g., a width or a thickness) of the line (or conductive trace) of the second circuit pattern layer 142. The test pattern layer of the second test pattern layer 2b may simulate the condition of the second circuit pattern layer 142 after an etching process. The condition of the second circuit pattern layer 142 can be detected by testing or measuring the test pattern layer of the second test pattern layer 2b.

Referred to FIGS. 1 and 2, a first probe 42a is used to contact the second testing via 162 on the first testing via 161 and the first pad portion 213 of the first heat dissipating structure 21 so as to be electrically connected to the first heat dissipating structure 21. A second probe 42b is used to contact the second testing via 162 on the first testing via 161 and the second pad portion 223 of the second heat dissipating structure 22 so as to be electrically connected to the second heat dissipating structure 22. A third probe 44a is used to contact the second testing via 162 on the first testing via 161 and the third pad portion 243 of the third heat dissipating structure 24 so as to be electrically connected to the third heat dissipating structure 24. A fourth probe 44b is used to contact the second testing via 162 on the first testing via 161 and the fourth pad portion 253 of the fourth heat dissipating structure 25 so as to be electrically connected to the fourth heat dissipating structure 25. An electrical current provided by a source is applied to the first test pattern layer 2a through the third probe 44a and the fourth probe 44b, and a voltage value is obtained from the first probe 42a and the second probe 42b. Thus, a sheet resistance is determined. The sheet resistance is used to calculate the thickness of the test structure 28 (including the first test circuit pattern 23 and the second test circuit pattern 26). The thickness of the conductive line 1411 (or conductive trace) of the first circuit pattern layer 141 is presumed to be the same as the thickness of the test structure 28 (including the first test circuit pattern 23 and the second test circuit pattern 26).

In order to obtain a stable voltage value, the electrical current provided by the source must be greater than a baseline value (e.g., 100 mA, or 180 mA). However, the width of the conductive line 1411 (or conductive trace) of the first circuit pattern layer 141, which is equal to the width of the first test circuit pattern 23 and the second test circuit pattern 26, is finer and finer. A large electrical current will generate heat or high temperature when it passes through a fine line (e.g., 2 μm) due to thermal effect of current. Since there is a positive relationship between the sheet resistance and the temperature, a high temperature will influence the sheet resistance. Thus, the calculated thickness will not be equal to the actual thickness of the conductive line 1411 (or conductive trace) of the first circuit pattern layer 141.

In the embodiment illustrated in FIG. 1 to FIG. 4, both of the first heat dissipating structure 21 and the second heat dissipating structure 22 have a large area so as to dissipate the heat of the first test circuit pattern 23. Similarly, both of the third heat dissipating structure 24 and the fourth heat dissipating structure 25 have a large area so as to dissipate the heat of the second test circuit pattern 26. That is, the heat dissipating layer 27 (including the heat dissipating structures 21, 22, 24, 25) is configured to reduce temperature rise of the test structure 28 (including the first test circuit pattern 23 and the second test circuit pattern 26) when a power or an electrical current is applied to the test structure 28 (including the first test circuit pattern 23 and the second test circuit pattern 26). In other words, the heat dissipating layer 27 is configured to transmit a heat generated from the test structure 28 when the power or the electrical current passes through the test structure 28. Thus, the thermal effect of current is reduced, and the calculated thickness will be equal to the actual thickness of the conductive line 1411 (or conductive trace) of the first circuit pattern layer 141. Further, a large width of the heat dissipating layer 27 (including the heat dissipating structures 21, 22, 24, 25) can avoid the burnout or open circuit fault of the test structure 28 (including the first test circuit pattern 23 and the second test circuit pattern 26) in a large electrical current. In addition to improve uniformity of electroplating, the large area of the heat dissipating layer 27 (including the heat dissipating structures 21, 22, 24, 25) can prevent excess etchant from attacking the seed layer 143 during an etching process, so as to avoid a peeling between the first test pattern layer 2a and the first dielectric layer 131.

Figure 5:
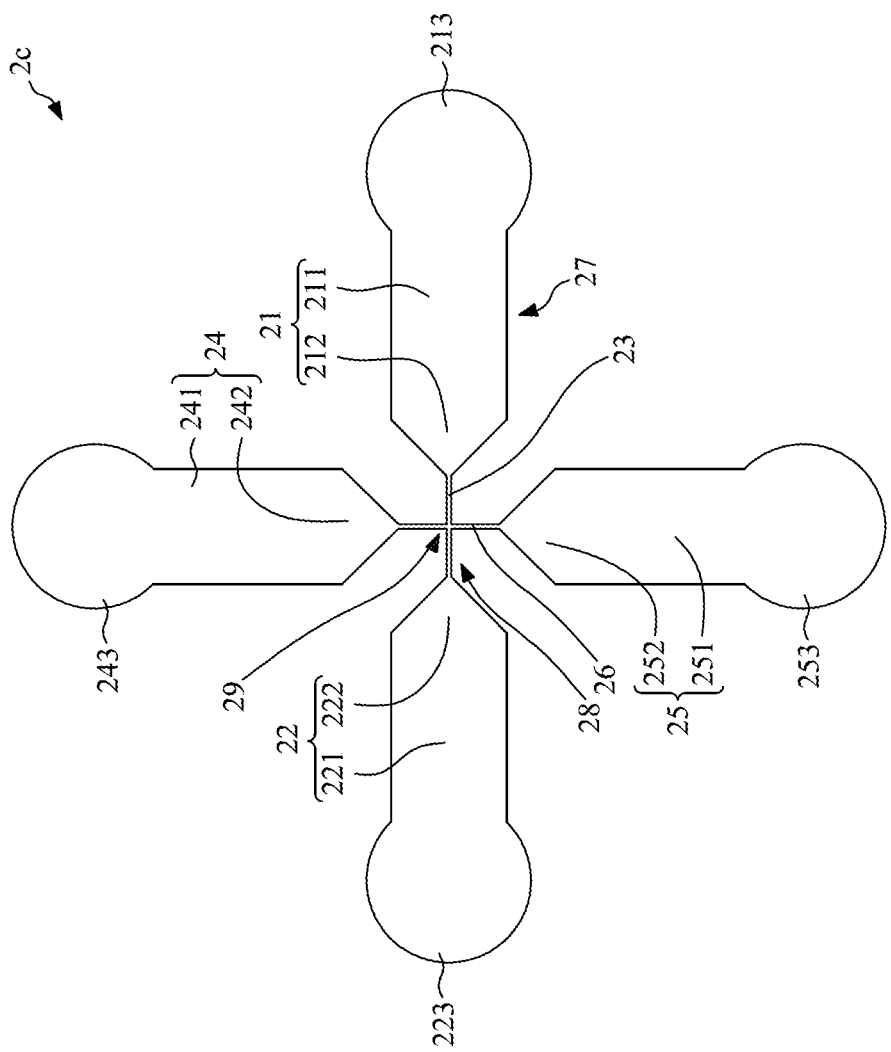
FIG. 5 illustrates a top view of a first test structure according to some embodiments of the present disclosure.

FIG. 5 illustrates a top view of a first test structure 2c according to some embodiments of the present disclosure. The first test structure 2c of FIG. 5 is similar to the first test pattern layer 2a of FIG. 2, except that the etching buffer structure 3 (including, for example, the first blocking structure 31, the second blocking structure 32, the third blocking structure 33 and the fourth blocking structure 34) of FIG. 2 is omitted.

Figure 6:
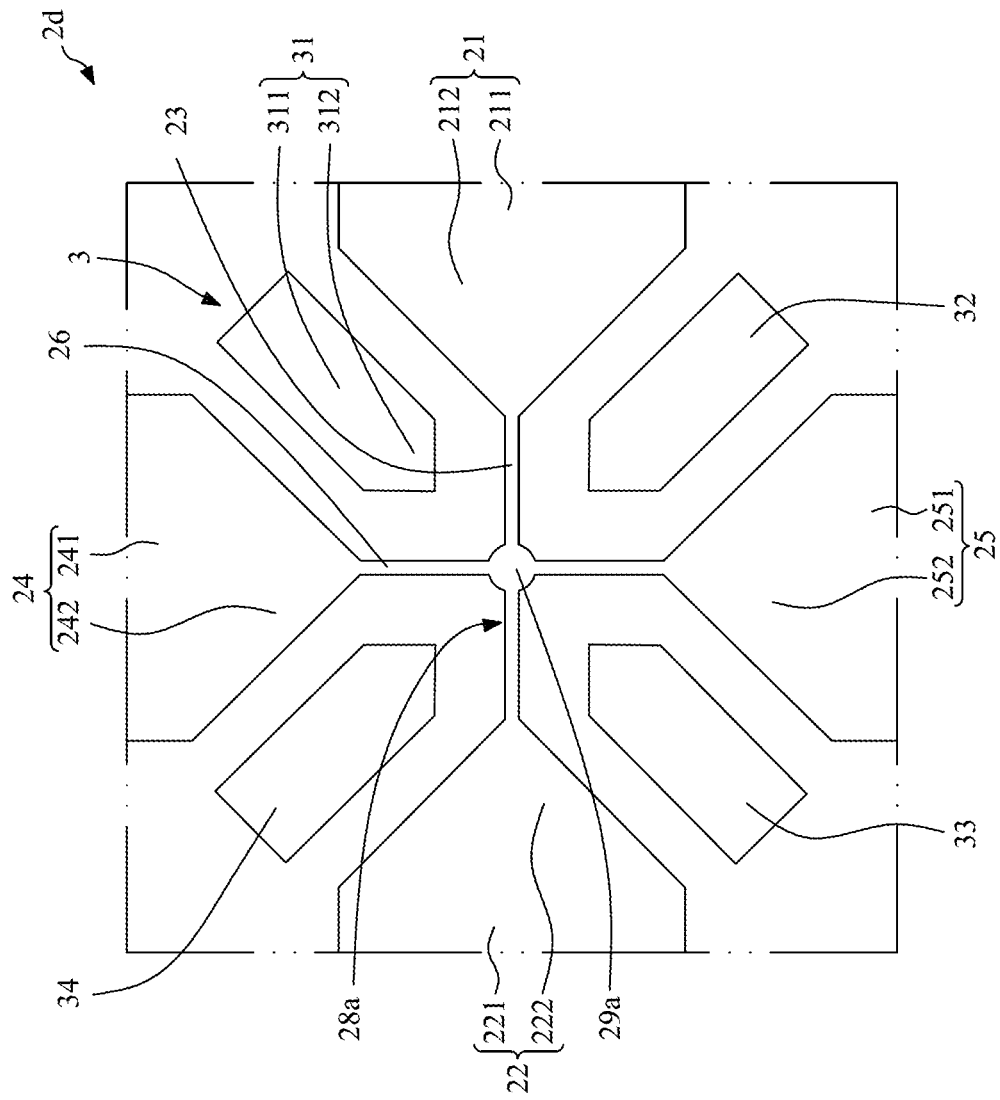
FIG. 6 illustrates an enlarged view of an area of a first test structure according to some embodiments of the present disclosure.

FIG. 6 illustrates an enlarged view of an area of a first test structure 2d according to some embodiments of the present disclosure. The first test structure 2d of FIG. 6 is similar to the first test pattern layer 2a of FIG. 3, except that the intersection portion 29a of the test structure 28a of FIG. 6 has a curved edge. The intersection portion 29a of the test structure 28a may be a part of a circle.

Figure 7:
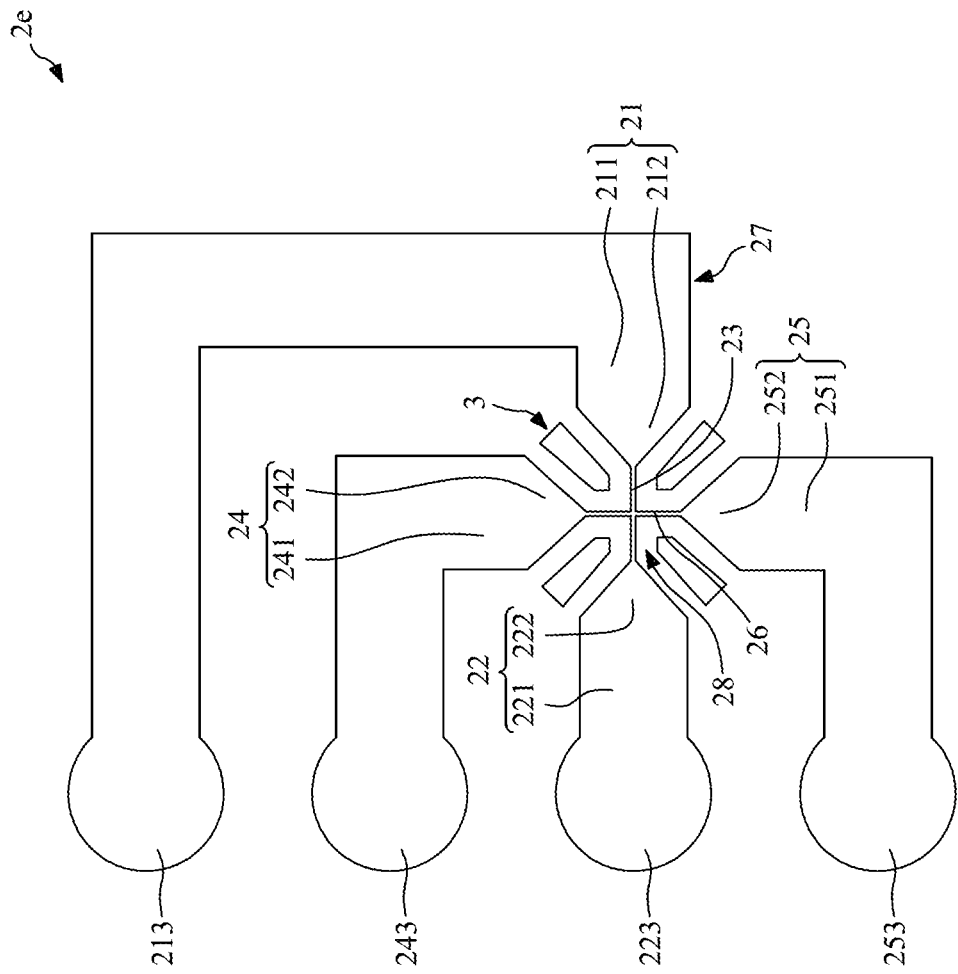
FIG. 7 illustrates a top view of a first test structure according to some embodiments of the present disclosure.
Figure 8:
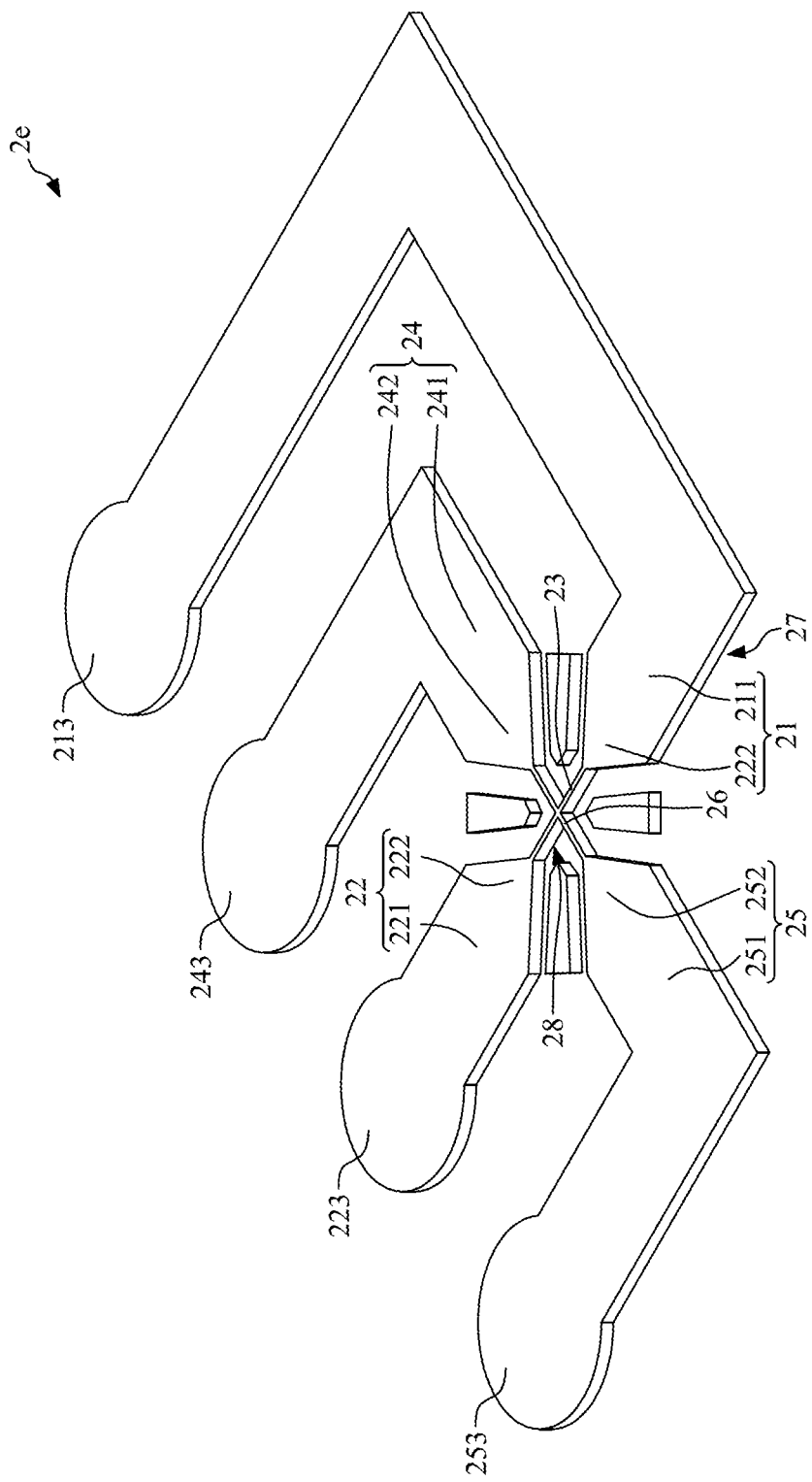
FIG. 8 illustrates a perspective view of the first test structure of FIG. 7.

FIG. 7 illustrates a top view of a first test structure 2e according to some embodiments of the present disclosure. FIG. 8 illustrates a perspective view of the first test structure 2e of FIG. 7. The first test structure 2e of FIG. 7 and FIG. 8 is similar to the first test pattern layer 2a of FIG. 2 and FIG. 4, except that the first pad portion 213 of the first heat dissipating structure 21, the second pad portion 223 of the second heat dissipating structure 22, the third pad portion 243 of the third heat dissipating structure 24 and the fourth pad portion 253 of the fourth heat dissipating structure 25 are arranged in a row.

FIG. 9 through FIG. 15 illustrate a method for manufacturing a wiring structure according to some embodiments of the present disclosure. In some embodiments, the method is for manufacturing the wiring structure 1 shown in FIG. 1.

Figure 9:
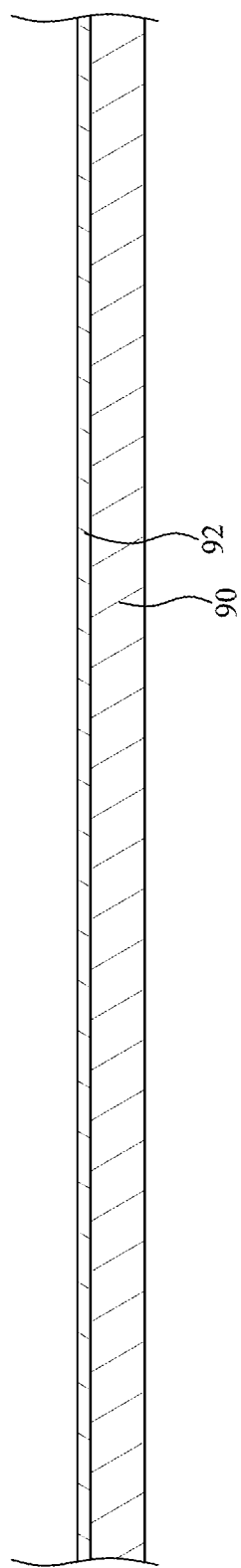
FIG. 9 illustrates one or more stages of an example of a method for manufacturing a wiring structure according to some embodiments of the present disclosure.

Referring to FIG. 9, a carrier 90 is provided. The carrier 90 may be in a wafer type or strip type. The carrier 90 may include a release layer 92 disposed thereon.

Figure 10:
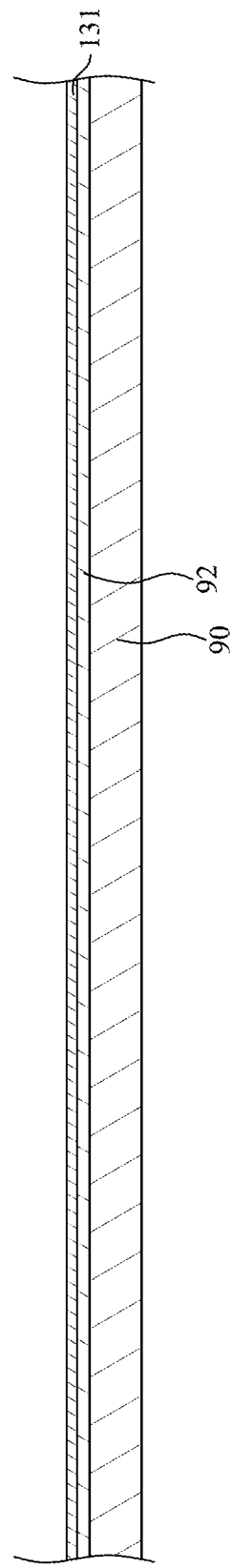
FIG. 10 illustrates one or more stages of an example of a method for manufacturing a wiring structure according to some embodiments of the present disclosure.

Referring to FIG. 10, a first dielectric layer 131 is formed on the release layer 92 of the carrier 90.

Figure 11:
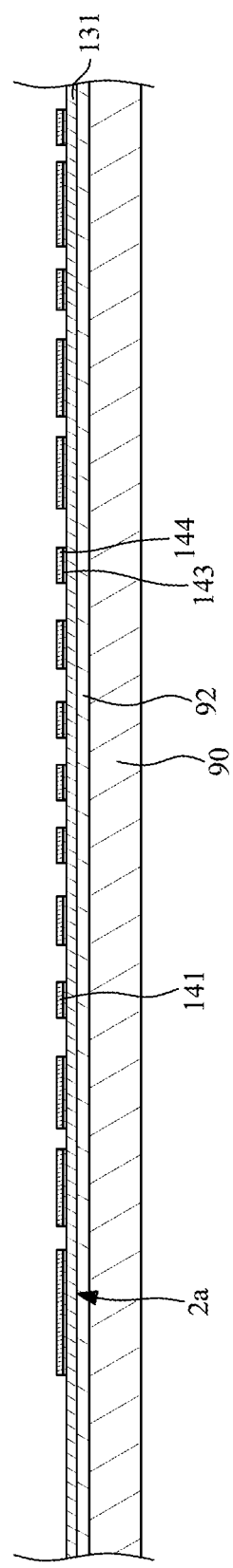
FIG. 11 illustrates one or more stages of an example of a method for manufacturing a wiring structure according to some embodiments of the present disclosure.

Referring to FIG. 11, a first circuit pattern layer 141 and a first test pattern layer 2a are formed on the first dielectric layer 131. The first circuit pattern layer 141 and the first test pattern layer 2a may include a seed layer 143 and a conductive layer 144 disposed on the seed layer 143.

Figure 12:
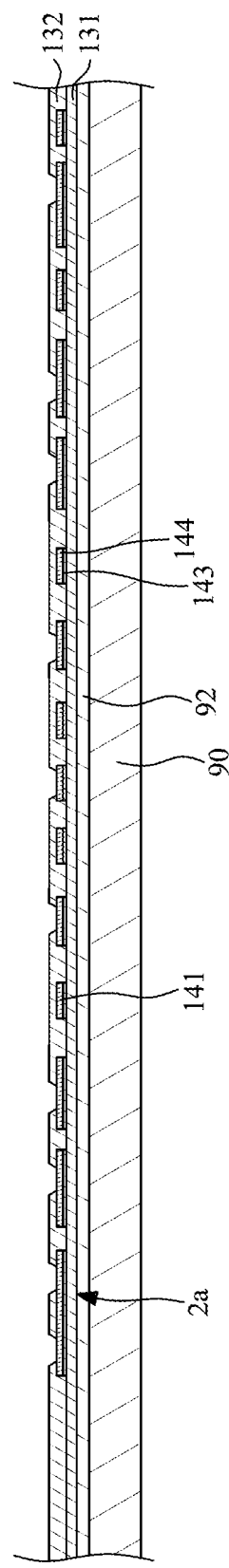
FIG. 12 illustrates one or more stages of an example of a method for manufacturing a wiring structure according to some embodiments of the present disclosure.

Referring to FIG. 12, a second dielectric layers 132 is formed on the first dielectric layer 131 to cover the first circuit pattern layer 141 and the first test pattern layer 2a. Then, the second dielectric layers 132 is patterned to form a plurality of openings to expose portions of the first circuit pattern layer 141 and portions (e.g., the first pad portion 213, the second pad portion 223, the third pad portion 243 and the fourth pad portion 253) of the first test pattern layer 2a.

Figure 13:
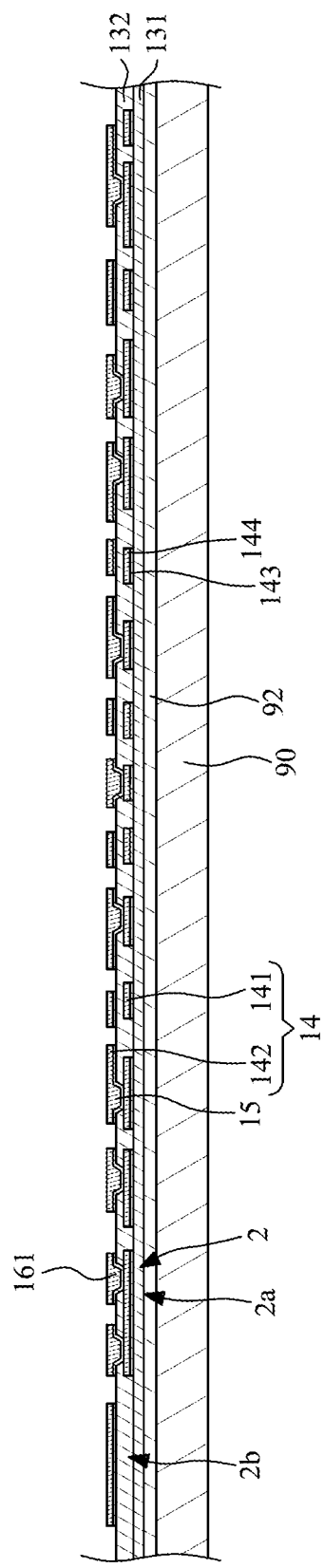
FIG. 13 illustrates one or more stages of an example of a method for manufacturing a wiring structure according to some embodiments of the present disclosure.

Referring to FIG. 13, a second circuit pattern layer 142 and a second test pattern layer 2b are formed on the second dielectric layer 132. Meanwhile, the first testing vias 161 and the inner vias 15 are formed in the openings of the second dielectric layers 132. The first testing vias 161 contact the exposed portions (e.g., the first pad portion 213, the second pad portion 223, the third pad portion 243 and the fourth pad portion 253) of the first test pattern layer 2a. The inner vias 15 contact the exposed portions of the first circuit pattern layer 141.

Figure 14:
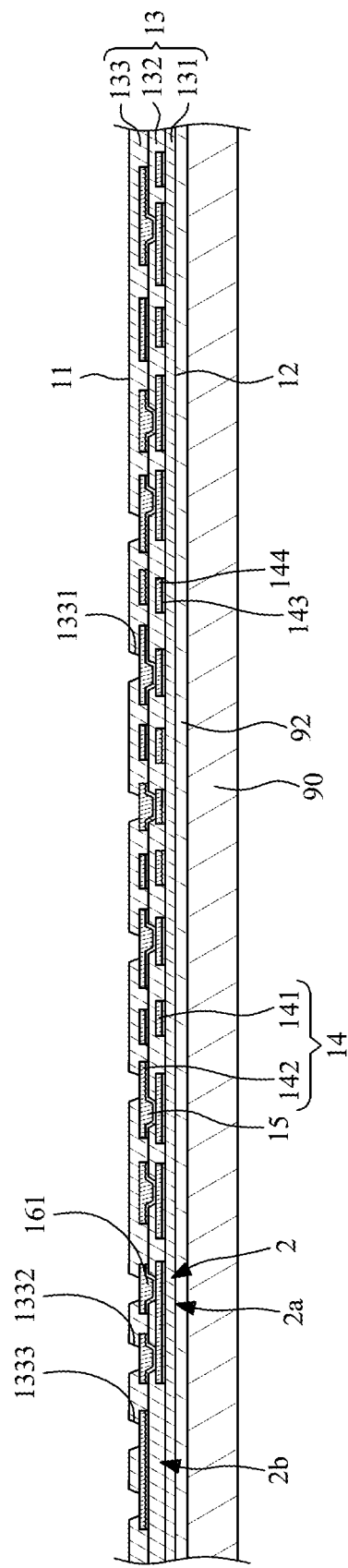
FIG. 14 illustrates one or more stages of an example of a method for manufacturing a wiring structure according to some embodiments of the present disclosure.

Referring to FIG. 14, a third dielectric layers 133 is formed on the second dielectric layer 132 to cover the second circuit pattern layer 142 and the second test pattern layer 2b. Then, the third dielectric layers 133 is patterned to form a plurality of openings 1331, 1332, 1333. The openings 1331 expose portions of the second circuit pattern layer 142. The openings 1332 expose the first testing vias 161. The openings 1333 expose portions of the second circuit pattern layer 142.

Figure 15:
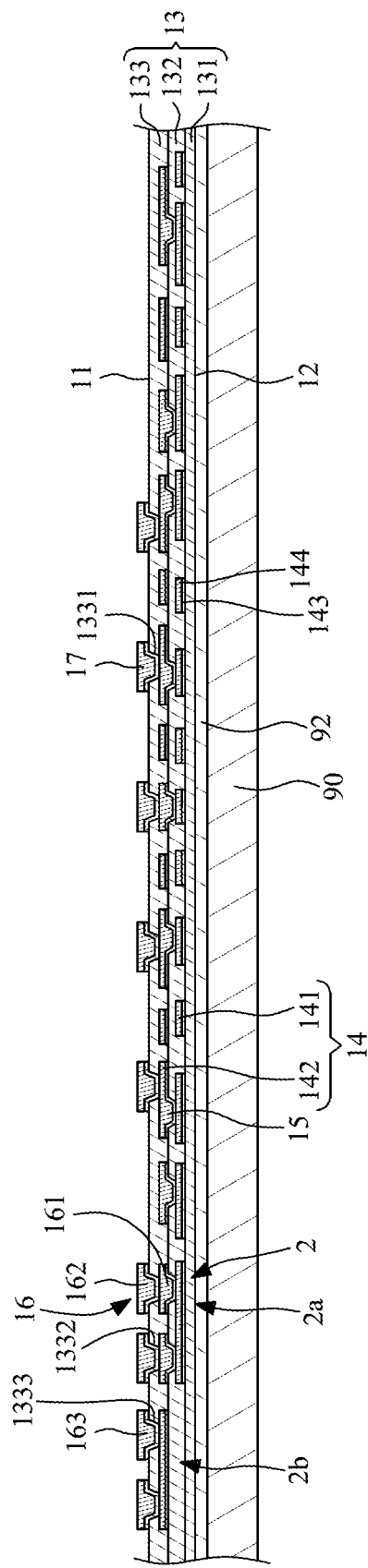
FIG. 15 illustrates one or more stages of an example of a method for manufacturing a wiring structure according to some embodiments of the present disclosure.

Referring to FIG. 15, a plurality of bonding pads 17 are formed in the openings 1331 of the third dielectric layers 133 to contact the exposed portions of the second circuit pattern layer 142. A plurality of second testing vias 162 are formed in the openings 1332 of the third dielectric layers 133 to contact the exposed first testing vias 161. A plurality of third testing vias 163 are formed in the openings 1333 of the third dielectric layers 133 to contact the exposed portions of the second test pattern layer 2b.

Then, a singulation process may be conducted to obtain a plurality of wiring structures 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a test pattern layer, comprising:
     a plurality of test circuit patterns intersected with each other at an intersection portion; and
     a heat dissipating structure disposed adjacent to the plurality of test circuit patterns, and configured to reduce temperature rise of the plurality of test circuit patterns when a power is applied to the plurality of test circuit patterns, wherein the heat dissipating structure is spaced apart from the intersection portion.

2. The wiring structure of claim 1, wherein the heat dissipating structure is disposed along at least one of the plurality of test circuit patterns.

3. The wiring structure of claim 2, wherein the heat dissipating structure includes a pattern extending from the at least one of the plurality of test circuit patterns.

4. The wiring structure of claim 1, wherein at least one of the plurality of test circuit patterns includes an end portion, and the heat dissipating structure is closer to the end portion than the intersection portion is.

5. The wiring structure of claim 1, wherein the heat dissipating structure includes a pattern tapered toward the intersection portion.

6. The wiring structure of claim 1, further comprising:
   a dielectric layer, wherein the plurality of test circuit patterns is disposed on the dielectric layer; and
   a circuit pattern layer disposed on the dielectric layer and spaced apart from the test pattern layer, wherein a width of one of the plurality of test circuit patterns is substantially equal to a width of a conductive line of the circuit pattern layer.

7. The wiring structure of claim 6, wherein the test pattern layer further includes a second test circuit pattern intersected with the one of the plurality of test circuit patterns at an intersection portion, and a width of the intersection portion is substantially equal to the width of the conductive line of the circuit pattern layer.

8. The wiring structure of claim 7, wherein in a top view, the one of the plurality of test circuit patterns is nonparallel with the second test circuit pattern.

9. A wiring structure, comprising:
   a dielectric layer;
   a circuit pattern layer disposed on the dielectric layer; and a test pattern layer disposed on the dielectric layer, and spaced apart from the circuit pattern layer, and comprising:
a test circuit pattern; and
an etching buffer layer disposed adjacent to the test circuit pattern, and configured to reduce a delamination between the test circuit pattern and the dielectric layer.

10. The wiring structure of claim 9, wherein a width of a portion of the etching buffer layer is greater than a width of a portion of the test circuit pattern.

11. The wiring structure of claim 10, wherein the test pattern layer includes a plurality of test circuit patterns intersected with each other at an intersection portion, one of the test circuit patterns includes an end portion, and the etching buffer layer is closer to the intersection portion than the end portion is.

12. The wiring structure of claim 11, wherein a width of the intersection portion is substantially equal to a width of a conductive line of the circuit pattern layer.

13. The wiring structure of claim 9, wherein a thickness of the etching buffer layer is substantially equal to a thickness of the test circuit pattern.

14. The wiring structure of claim 9, wherein a seed layer is disposed between the test circuit pattern and the dielectric layer.

15. The wiring structure of claim 14, wherein a width of the seed layer is less than a width of the test circuit pattern.

16. A wiring structure, comprising:
a dielectric layer having a first region and a second region;
a circuit pattern layer disposed in the first region; and
a test pattern layer disposed in the second region, and comprising:
at least two test circuit patterns intersected with each other at an intersection portion; and
a heat dissipating layer disposed around the intersection portion.

17. The wiring structure of claim 16, wherein the heat dissipating layer includes at least two heat dissipating patterns connected to the at least two test circuit patterns, respectively.

18. The wiring structure of claim 17, wherein the heat dissipating layer further includes at least one second heat dissipating pattern spaced apart from the at least two the test circuit patterns, and the second heat dissipating pattern is disposed between the test circuit patterns.

19. The wiring structure of claim 18, wherein the at least one second heat dissipating pattern includes a plurality of second heat dissipating patterns disposed around the intersection portion.

* * * * *